(12) United States Patent
Chen

(10) Patent No.: US 9,121,646 B2
(45) Date of Patent: Sep. 1, 2015

(54) HEAT-DISSIPATION UNIT COATED WITH OXIDATION-RESISTANT NANO THIN FILM AND METHOD OF DEPOSITING THE OXIDATION-RESISTANT NANO THIN FILM THEREOF

(71) Applicant: Asia Vital Components Co., Ltd., Sinjhuang, Taipei County (TW)

(72) Inventor: Ying-Tung Chen, Taoyuan (TW)

(73) Assignee: Asia Vital Components Co., Ltd., New Taipei (TW)

( * ) Notice: Subject to any disclaimer, the term of this patent is extended or adjusted under 35 U.S.C. 154(b) by 72 days.

(21) Appl. No.: 13/971,611

(22) Filed: Aug. 20, 2013

(65) Prior Publication Data

US 2013/0337169 A1 Dec. 19, 2013

Related U.S. Application Data

(62) Division of application No. 12/938,334, filed on Nov. 2, 2010, now abandoned.

(51) Int. Cl.
| | |
|---|---|
| *B05D 3/02* | (2006.01) |
| *F28D 15/04* | (2006.01) |
| *B82Y 30/00* | (2011.01) |
| *C23C 18/12* | (2006.01) |
| *H01L 23/36* | (2006.01) |
| *H01L 23/427* | (2006.01) |
| *H01L 23/473* | (2006.01) |
| *H05K 13/00* | (2006.01) |
| *F28D 15/02* | (2006.01) |

(52) U.S. Cl.
CPC ............... *F28D 15/04* (2013.01); *B82Y 30/00* (2013.01); *C23C 18/1204* (2013.01); *C23C 18/1212* (2013.01); *C23C 18/1216* (2013.01); *C23C 18/1254* (2013.01); *C23C 18/1295* (2013.01); *H01L 23/36* (2013.01); *H01L 23/427* (2013.01); *H01L 23/473* (2013.01); *H05K 13/00* (2013.01); *F28D 15/0233* (2013.01); *F28D 15/0275* (2013.01); *F28F 2245/00* (2013.01); *H01L 2924/0002* (2013.01)

(58) Field of Classification Search
USPC ........................................................ 427/377
See application file for complete search history.

(56) References Cited

U.S. PATENT DOCUMENTS

| | | | | |
|---|---|---|---|---|
| 2001/0054500 | A1* | 12/2001 | Raybould et al. | 165/166 |
| 2006/0215715 | A1* | 9/2006 | Kouta et al. | 372/36 |
| 2008/0194084 | A1* | 8/2008 | Kononchuk et al. | 438/488 |

OTHER PUBLICATIONS

Hua et al "Cyclic Oxidation of Mn-Co Spinel Coated SUS-430 Alloy in the Cathodic Atmosphere of Solid Oxide Fuel Cells" Journal of Power Sources 185 (2008) 419-422.*

*Primary Examiner* — Nathan Empie
(74) *Attorney, Agent, or Firm* — C. G. Mersereau; Nikolai & Mersereau, P.A.

(57) ABSTRACT

A heat-dissipation unit coated with oxidation-resistant nano thin film includes a metal main body having a heat-absorbing portion and a heat-dissipating portion, both of which are coated with at least a nano metal compound thin film. To form the nano metal compound thin film on the heat-dissipation unit, first form at least a nano compound coating on an outer surface of the heat-dissipation unit, and then supply a reduction gas into a high-temperature environment to perform a heat treatment and a reduction process on the heat-dissipation unit and the nano compound coating thereof, and finally, a nano metal compound thin film is formed on the surface of the heat-dissipation unit after completion of the heat treatment and the reduction process. With the nano metal compound thin film, the heat-dissipation unit is protected against formation of oxide on its surface and accordingly against occurrence of increased thermal resistance thereof.

5 Claims, 22 Drawing Sheets

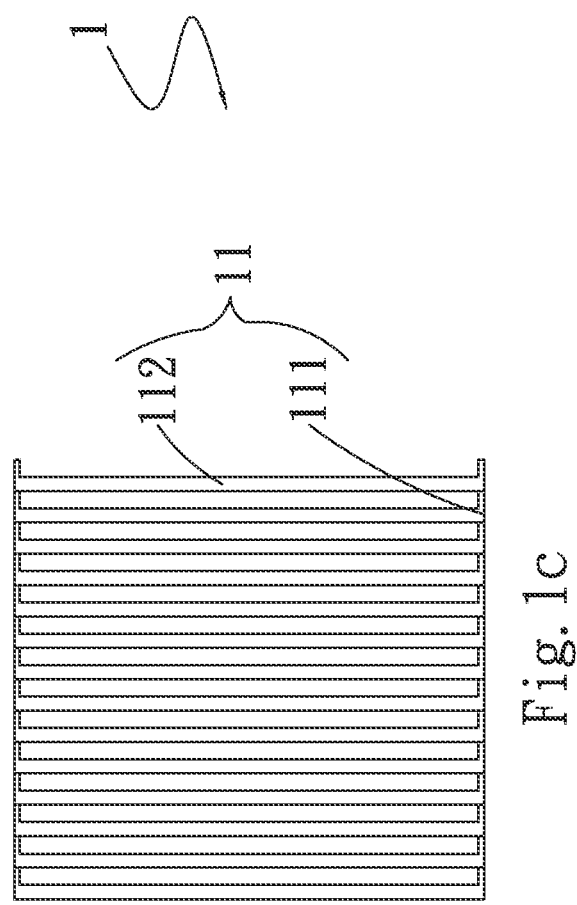

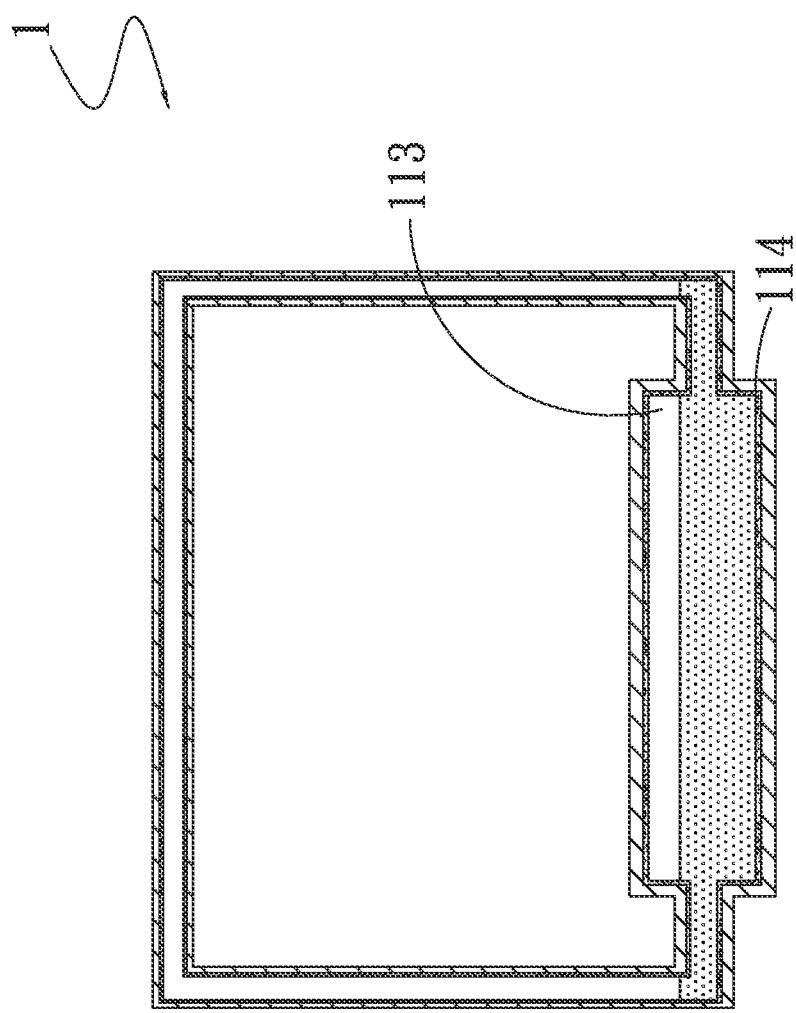

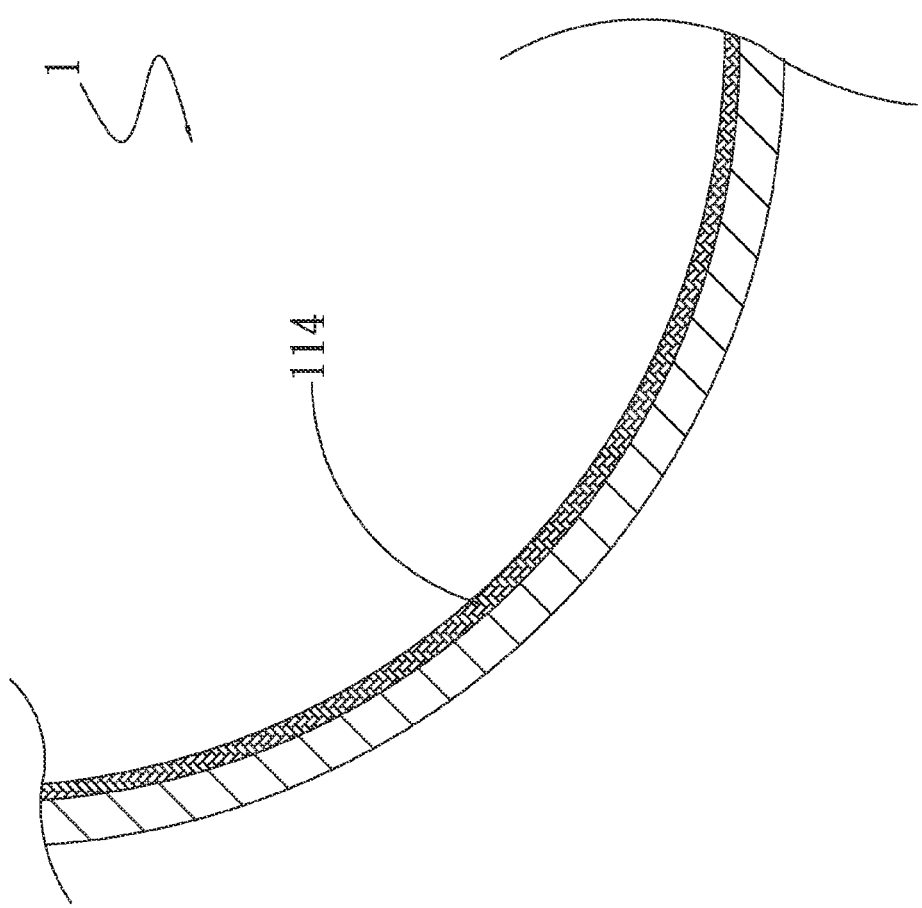

's power is now close to 100 W and the temperature thereof
HEAT-DISSIPATION UNIT COATED WITH OXIDATION-RESISTANT NANO THIN FILM AND METHOD OF DEPOSITING THE OXIDATION-RESISTANT NANO THIN FILM THEREOF

CROSS-REFERENCE TO RELATED APPLICATIONS

The present application is a division of U.S. patent application Ser. No. 12/938,334, filed on Nov. 2, 2010, titled Heat-Dissipation Unit Coated with Oxidation-Resistant Nano Thin Film and Method of Depositing the Oxidation-Resistant Nano Thin Film Thereof, listing Ying-Tung Chen as inventor.

This application claims the priority benefit of Taiwan patent application number 098145478 filed on Dec. 29, 2009.

FIELD OF THE INVENTION

The present invention relates to a heat-dissipation unit coated with oxidation-resistant nano thin film and a method of depositing the oxidation-resistant nano thin film on the heat-dissipation unit.

BACKGROUND OF THE INVENTION

When an electronic device operates, electronic elements inside the device would produce heat. The heat is produced mainly by an operating chip during operation thereof. With the constantly increased performance thereof, the chip's power is now close to 100 W and the temperature thereof would exceed 100° C. if no proper heat dissipation mechanism is provided.

The currently used chips are usually made of a semiconductor material, such as silicon. Since a chip internally includes a large quantity of metal wires and insulating thin films, and the thermal expansion coefficient of the metal wire material might be several times as high as that of the insulating material, the chip would usually crack and become damaged when it continuously works at a temperature higher than 90° C.

To prevent the chip from overheat and burnout, waste heat produced by electric current must be removed from the electronic elements as soon as possible. To quickly remove the produced heat from the chip, the chip is usually arranged to contact with a copper sheet or is embedded in a metal-based ceramic sintered body, such as aluminum-based silicon carbide, which has high thermal conductivity. In addition, a heat-dissipation unit is needed to help increasing the heat dissipation efficiency, so as to avoid an overheated and burnt-out chip. The heat-dissipation unit is mainly a radiating fin assembly, a heat sink or a heat pipe. A cooling fan can also be used to assist in forced convection, in order to achieve desired heat dissipating and cooling effects.

A metal-made heat radiating fin exposed to air would gradually become oxidized to result in electrical potential difference in the radiating fin. Such internal electrical potential difference would in turn cause electrochemical reaction to form metal oxide on the radiating fin. A metal oxide has a thermal conducting efficiency much lower than that of a pure metal, and would therefore largely reduce the heat dissipating effect and thermal conducting efficiency of the metal radiating fin. When the oxidation becomes worse, the oxidized metal oxide having loose structure tends to peel off from the metal surface of the radiating fin to contaminate the chip in contact with the radiating fin.

Further, an oxidized metal surface would change in color to adversely affect the appearance of the metal material.

And, a metal radiating fin formed through metal (such as copper or aluminum) powder sintering process and having a porous structure tends to more easily have reduced heat dissipation performance due to oxidation. To prevent oxidation, the metal radiating fin is usually externally coated with a layer of nickel or tin through a water solution process. The nickel can be coated on the radiating fin in different ways, including electroplating and chemical plating (electroless plating). However, the coating obtained through the water solution process is easily subjected to contamination, such as adsorption of acid group anions, which would corrode the semiconductor packaging.

Further, the nickel coating or the tin coating usually has thermal conducting efficiency much lower than that of the frequently used copper radiating fin, and would therefore have adverse influence on the heat dissipating effect of copper.

It is therefore tried by the inventor to develop a heat-dissipation unit coated with oxidation-resistant nano thin film and a method of depositing such oxidation-resistant nano thin film on the heat-dissipation unit, in order to overcome the drawbacks in the prior art.

SUMMARY OF THE INVENTION

A primary object of the present invention is to provide a heat-dissipation unit coated with oxidation-resistant nano thin film.

Another object of the present invention is to provide a method of depositing an oxidation-resistant nano thin film on a heat-dissipation unit.

To achieve the above and other objects, the heat-dissipation unit coated with oxidation-resistant nano thin film according to the present invention includes a metal main body having a heat-absorbing portion and a heat-dissipating portion, and both of the heat-absorbing portion and the heat-dissipating portion are coated with at least a nano metal compound thin film. The heat-dissipation unit can be a heat sink, a uniform temperature plate, a radiating fin assembly, a heat pipe, a loop heat pipe, or a water block. The nano metal compound thin film is formed via a reaction of a reduction gas with at least a nano compound coating and the metal main body. The metal main body can be made of copper, aluminum, nickel or stainless steel.

To achieve the above and other objects, the method of depositing an oxidation-resistant nano thin film on a heat-dissipation unit according to the present invention includes the steps of providing a heat-dissipation unit; forming at least a nano compound coating on a surface of the heat-dissipation unit; positioning the heat-dissipation unit in a high-temperature environment; supplying a reduction gas into the high-temperature environment to perform a heat treatment and a reduction process on the heat-dissipation unit and the nano compound coating on the surface of the heat-dissipation unit; and forming a nano metal compound thin film on the surface of the heat-dissipation unit after completion of the heat treatment and the reduction process. The heat-dissipation unit can be a heat sink, a uniform temperature plate, a radiating fin assembly, a heat pipe, a loop heat pipe, or a water block. The reduction gas can be any one of $H_2S$, $H_2$, CO, $NH_3$, $CH_4$, and any combination thereof, and is preferably $H_2$. The nano compound coating can be any oxide, nitride, carbide, and sulfide, and is preferably an oxide. The oxide is selected from the group consisting of $SiO_2$, $TiO_2$, $Al_2O_3$, $ZrO_2$, CaO, $K_2O$, and ZnO. The heat-dissipation unit is made of a material selected from the group consisting of copper, aluminum, nickel, and stainless steel. The nano compound coating is formed on the surface of the heat-dissipation unit through a process selected from the group consisting of physical vapor deposition (PVD), chemical vapor deposition (CVD), and sol-gel deposition. Using the oxidation-resistant nano thin film deposition method of the present invention, at least a nano metal compound thin film can be formed on the heat-dissipation unit to protect the latter against formation of oxide on its surface and accordingly against occurrence of increased thermal resistance thereof.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 1c is a schematic view of a heat-dissipation unit according to a third embodiment of the present invention;

FIG. 1c is a schematic view of a heat-dissipation unit according to a fifth embodiment of the present invention;

FIG. 1g is an enlarged view of the circled area 1g of FIG. 1a;

FIG. 2b is a schematic view of a heat-dissipation unit according to an eighth embodiment of the present invention;

FIG. 2c is an enlarged view of the circled area 2c of FIG. 2a;

DETAILED DESCRIPTION OF THE PREFERRED EMBODIMENTS

Figure 1A:
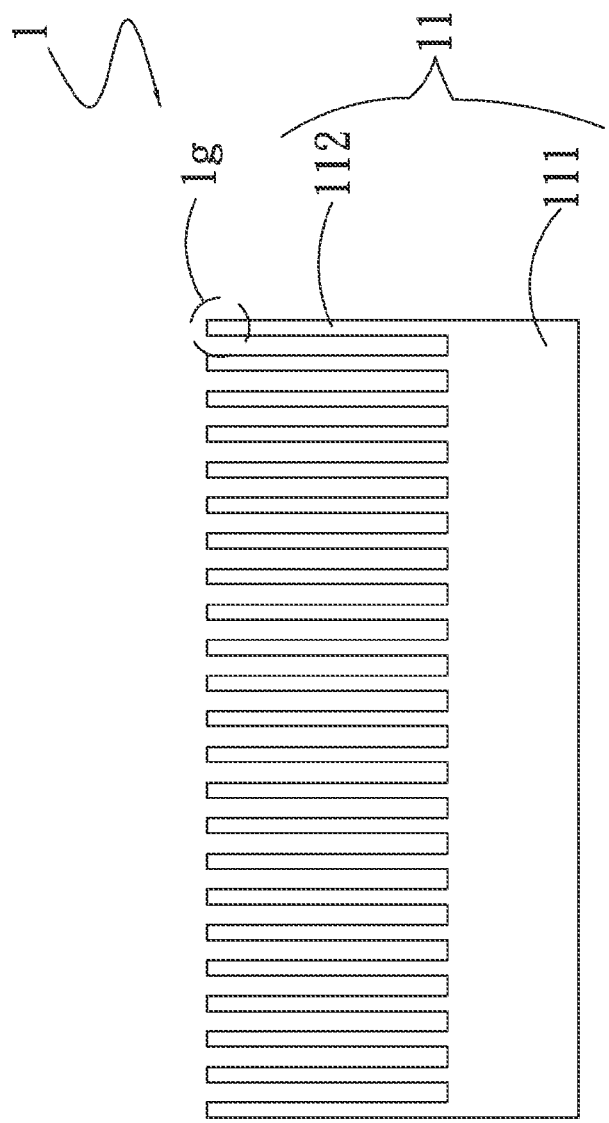
FIG. 1a is a schematic view of a heat-dissipation unit according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Please refer to FIGS. 1a, 1b, 1c, 1d, 1e, 1f, 1g and 4. As shown, a heat-dissipation unit 1 coated with oxidation-resistant nano thin film according to any one of a first to a sixth embodiment of the present invention includes a metal main body 11 having a heat-absorbing portion 111 and a heat-dissipating portion 112. The heat-absorbing portion 111 is arranged on one side of the metal main body 11, and the heat-dissipating portion 112 is arranged on an opposite side of the metal main body 11. The heat-absorbing portion 111 and the heat-dissipating portion 112 are externally coated with at least a nano metal compound thin film 2.

The metal main body 11 is formed of a material selected from the group consisting of copper, aluminum, nickel, and stainless steel.

Figure 1B:
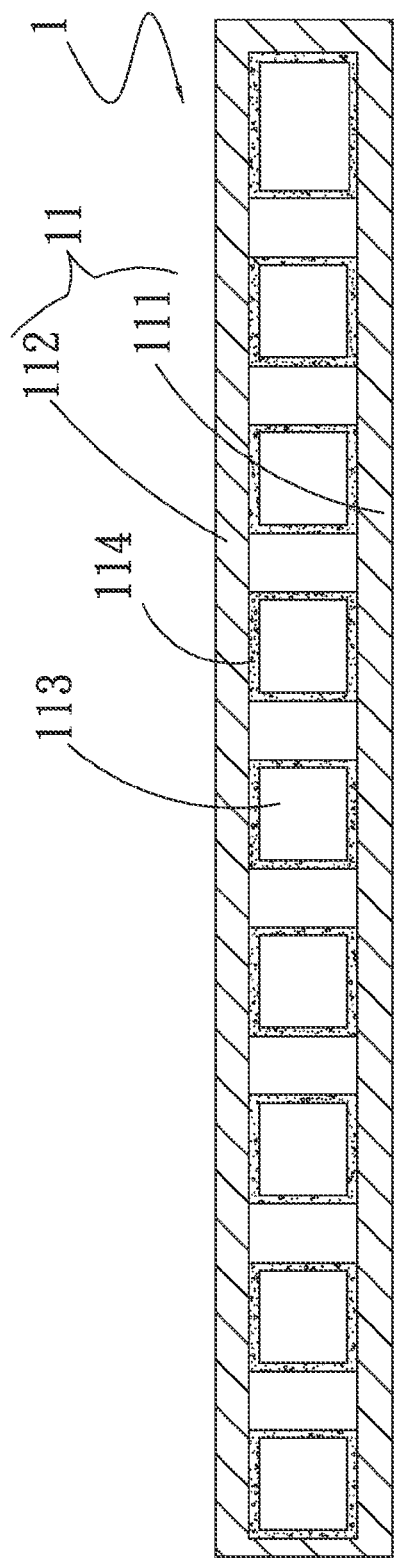
FIG. 1b is a schematic view of a heat-dissipation unit according to a second embodiment of the present invention.
Figure 1D:
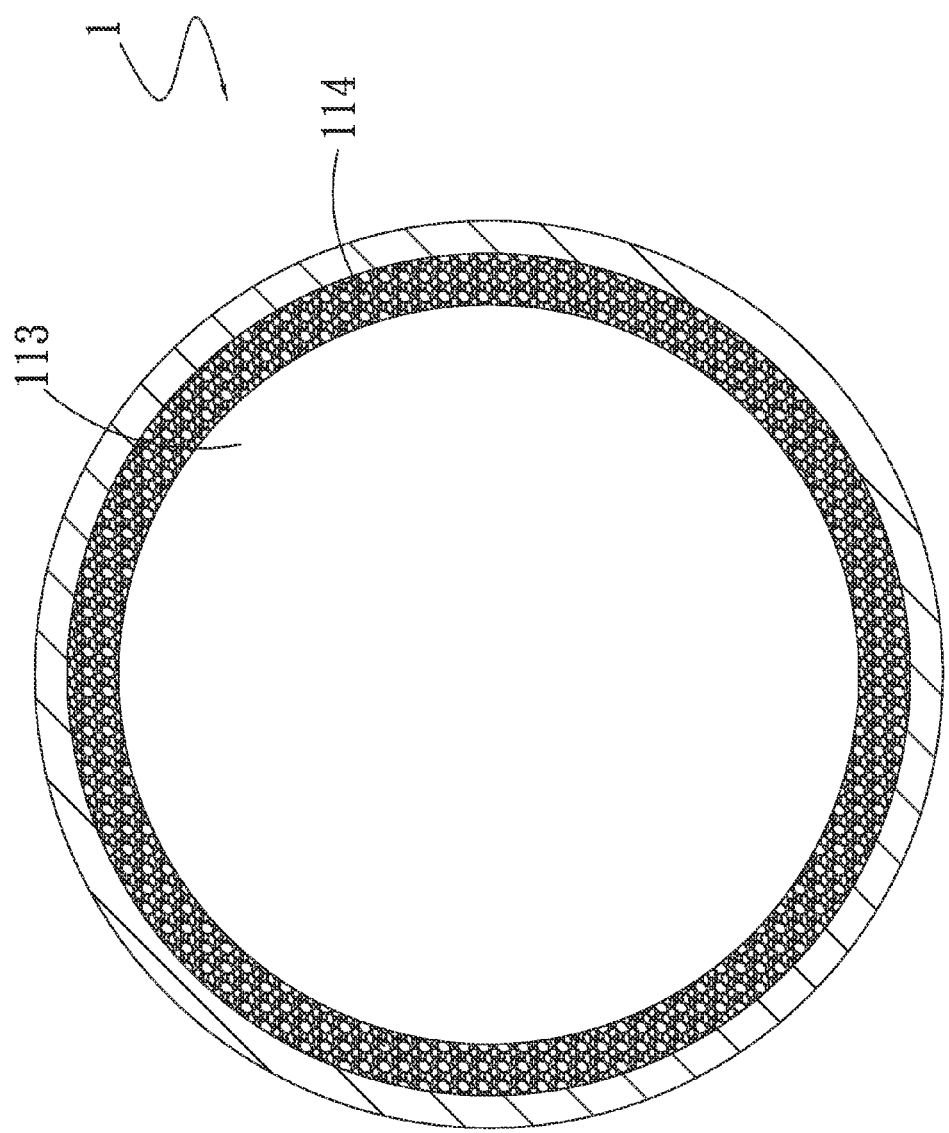
FIG. 1d is a schematic view of a heat-dissipation unit according to a fourth embodiment of the present invention.
Figure 1F:
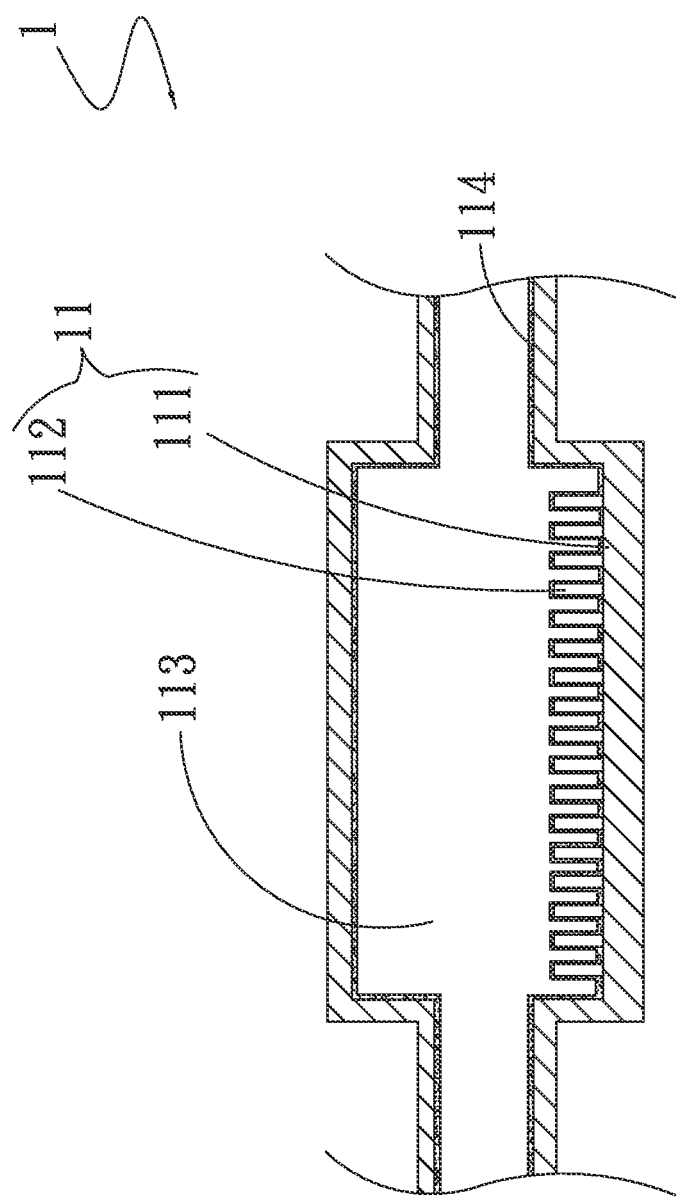
FIG. 1f is a schematic view of a heat-dissipation unit according to a sixth embodiment of the present invention.
Figure 1G:
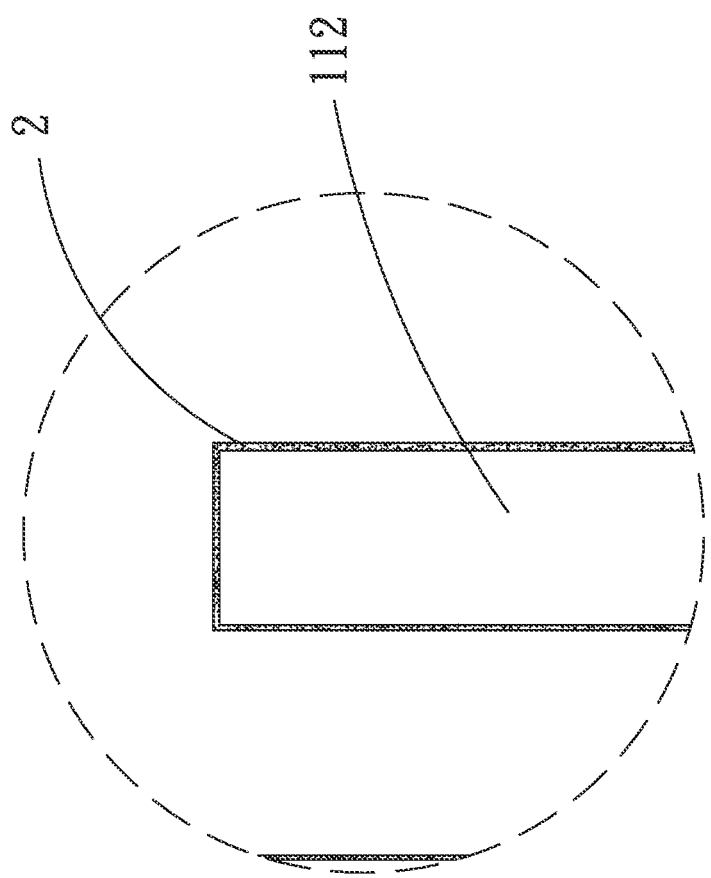

In the first embodiment of the present invention, the heat-dissipation unit 1 is a heat sink as shown in FIG. 1a. In the second embodiment of the present invention, the heat-dissipation unit 1 is a uniform temperature plate as shown in FIG. 1b. In the third embodiment of the present invention, the heat-dissipation unit 1 is a radiating fin assembly as shown in FIG. 1c. In the fourth embodiment of the present invention, the heat-dissipation unit 1 is a heat pipe as shown in FIG. 1d. In the fifth embodiment of the present invention, the heat-dissipation unit 1 is a loop heat pipe as shown in FIG. 1e. In the sixth embodiment of the present invention, the heat-dissipation unit 1 is a water block as shown in FIG. 1f.

The at least one nano metal compound thin film 2 is formed by reaction of at least a reduction gas 5 with at least one nano compound coating 6 and the metal main body 11. The at least one nano compound coating 6 is coated on an outer surface of the metal main body 11, and the reduction gas is supplied to the metal main body 11 in a high-temperature environment, so that a diffusion reaction and a reduction-oxidation reaction occur between the reduction gas 5 and the nano compound coating 6 and the metal main body 11. At completion of the reactions, the at least one nano metal compound thin film 2 is formed on the metal main body 11.

Please refer to FIGS. 1b, 1d, 1e, 1f, 2a, 2b, 2c and 7. As shown, the heat-dissipation unit 1 according to any one of the second, the fourth, the fifth and the sixth embodiment of the present invention includes a metal main body 11 defining a chamber 113 therein. The chamber 113 is provided on an interior surface thereof with a wick structure 114, over which at least a nano metal compound thin film 2 is coated, as can be most clearly seen in FIG. 2c.

The metal main body 11 is formed of a material selected from the group consisting of copper, aluminum, nickel, and stainless steel.

Figure 2A:
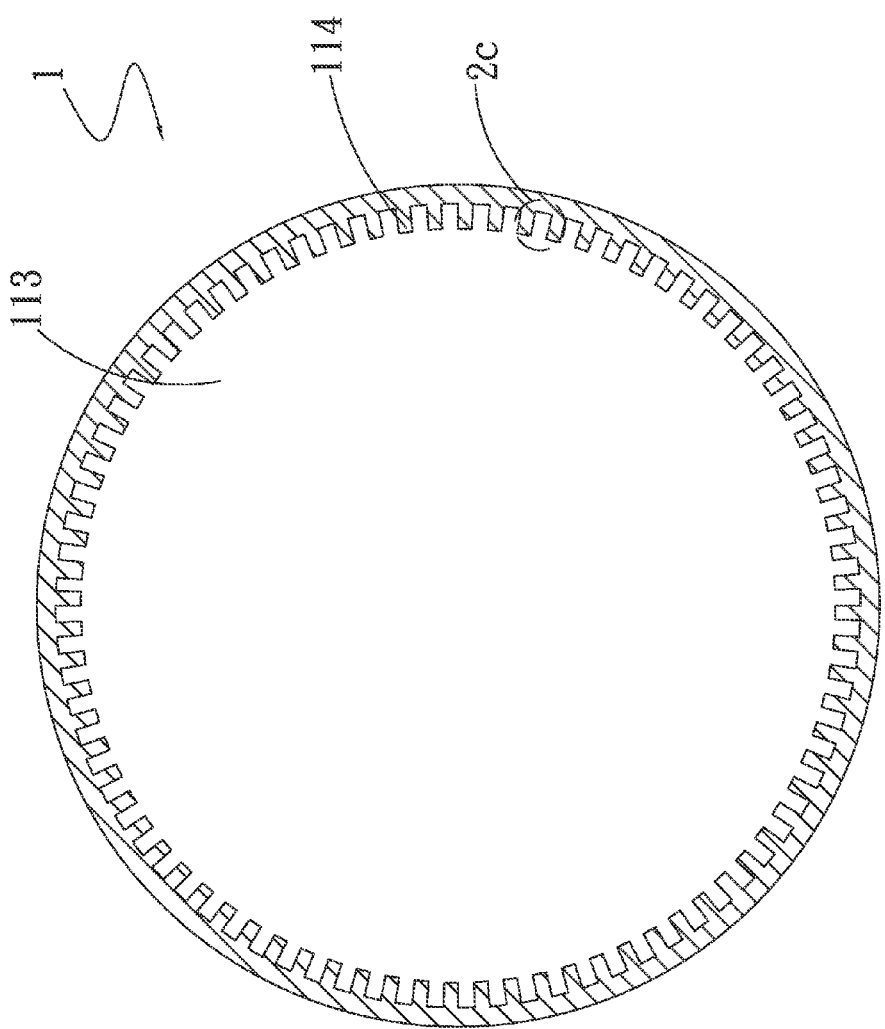
FIG. 2a is a schematic view of a heat-dissipation unit according to a seventh embodiment of the present invention.
Figure 2C:
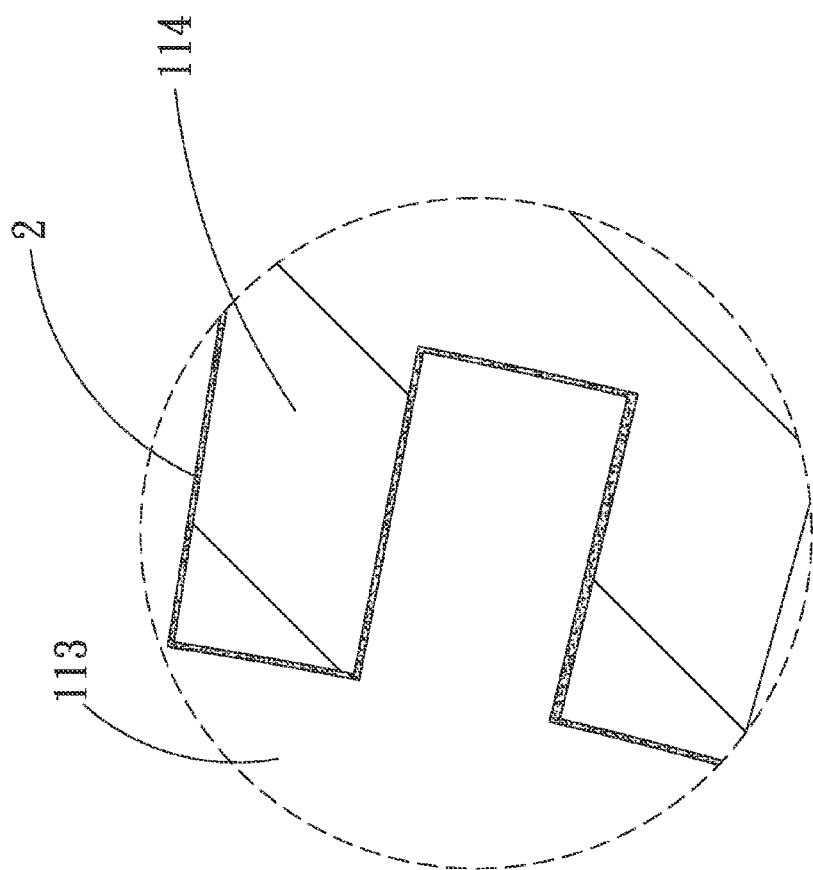

The wick structure 114 can be a grooved wick structure as shown in FIG. 2a, a mesh wick structure as shown in FIG. 2b, a copper sintered porous wick structure as shown FIG. 1d, or a composite wick structure including any combination of the grooved, mesh, and copper sintered porous wick structures (not shown).

The wick structure 114 is formed of a material selected from the group consisting of copper, aluminum, nickel, and stainless steel.

The heat-dissipation unit 1 can be any one of the uniform temperature plate shown in FIG. 1b, the heat pipe shown in FIG. 1d, the loop heat pipe shown in FIG. 1e, and the water block shown in FIG. 1f.

The at least one nano metal compound thin film 2 is formed by reaction of at least a reduction gas 5 with at least one nano compound coating 6 and the aforesaid wick structure 114. The wick structure 114 is coated with the at least one nano compound coating 6, and the metal main body 11 is subjected to a heat treatment in a high-temperature environment while the reduction gas is supplied into the metal main body 11, so that a diffusion reaction and a reduction-oxidation reaction occur between the reduction gas 5 and the nano compound coating 6 and the wick structure 114. At completion of the reactions, the at least one nano metal compound thin film 2 is formed on the wick structure 114.

In the above embodiments, the nano compound coating 6 can be formed of any oxide, nitride, carbide or sulfide; and is preferably formed of an oxide. The oxide is selected from the group consisting of $SiO_2$, $TiO_2$, $Al_2O_3$, $ZrO_2$, CaO, $K_2O$, and ZnO. And, the reduction gas 5 can be any one of $H_2S$, $H_2$, CO, and $NH_3$; and is preferably $H_2$.

In the above embodiments, only one single layer or a plurality of layers of the nano compound coating 6 can be formed. In the case of forming a plurality of layers of the nano compound coating 6, the oxide, nitride, carbide and sulfide can be alternately coated.

Figure 3:
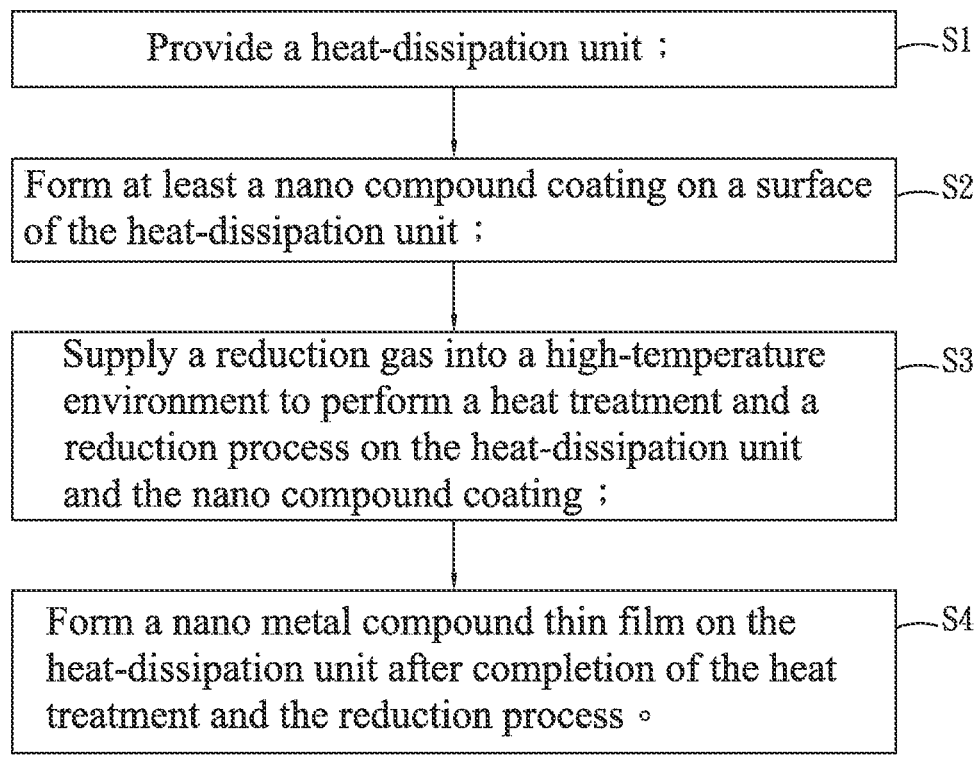
FIG. 3 is a flowchart showing the steps included in a method of depositing an oxidation-resistant nano thin film on a heat-dissipation unit according to a first embodiment of the present invention.

FIG. 3 is a flowchart showing the steps included in a method according to a first embodiment of the present invention for depositing an oxidation-resistant nano thin film on a heat-dissipation unit. Please refer to FIGS. 1a, 3 and 4 at the same time. The method includes the following steps:

Step S1: Providing a heat-dissipation unit 1.

A heat-dissipation unit 1 is provided. The heat-dissipation unit 1 can be a heat sink as shown in FIG. 1a, a uniform temperature plate as shown in FIG. 1b, a radiating fin assembly as shown in FIG. 1c, a heat pipe as shown in FIG. 1d, a loop heat pipe as shown in FIG. 1e, or a water block as shown in FIG. 1f. The method according to the first embodiment of the present invention is explained based on a heat-dissipation unit 1 configured as a heat sink.

Step S2: Forming at least a nano compound coating 6 on an outer surface of the heat-dissipation unit 1 (i.e. the heat sink).

At least a nano compound coating 6 is formed on an outer surface of the heat-dissipation unit 1 (i.e. the heat sink). The nano compound coating 6 can be formed of any oxide, nitride, carbide or sulfide. The method according to the first embodiment of the present invention is explained based on a nano compound coating 6 formed of an oxide. The oxide is selected from the group consisting of $SiO_2$, $TiO_2$, $Al_2O_3$, $ZrO_2$, CaO, $K_2O$, and ZnO. And, only one single layer or a plurality of layers of the nano compound coating 6 can be formed. In the case of forming a plurality of layers of the nano compound coating 6, either different oxides are alternatively coated or the oxide, nitride, carbide and sulfide are alternately coated.

The nano compound coating 6 can be formed through physical vapor deposition (PVD), chemical vapor deposition (CVD), or sol-gel process. The sol-gel process can be implemented in any one of the following manners: dip-coating deposition, settle-coating deposition, spin-coating deposition, brush-coating deposition, and wet-coating deposition.

The method according to the first embodiment of the present invention is explained based on at least one layer of the nano compound coating 6 formed on the heat-dissipation unit 1 through PVD. The deposited nano compound coating 6 has a thickness about 1 nm~100 nm. In the process of PVD, when the heat-dissipation unit 1 has a temperature about 150° C., the target material is zirconium (Zr) or titanium (Ti), and the vacuum degree of the working environment is $10^{-3}$ mbar, a nano compound coating 6 with high density and smoothness can be obtained.

Step S3: Supplying a reduction gas 5 into a high-temperature environment to perform a heat treatment and a reduction process on the heat-dissipation unit 1 and the nano compound coating 6 on the surface of the heat-dissipation unit 1.

Figure 4:
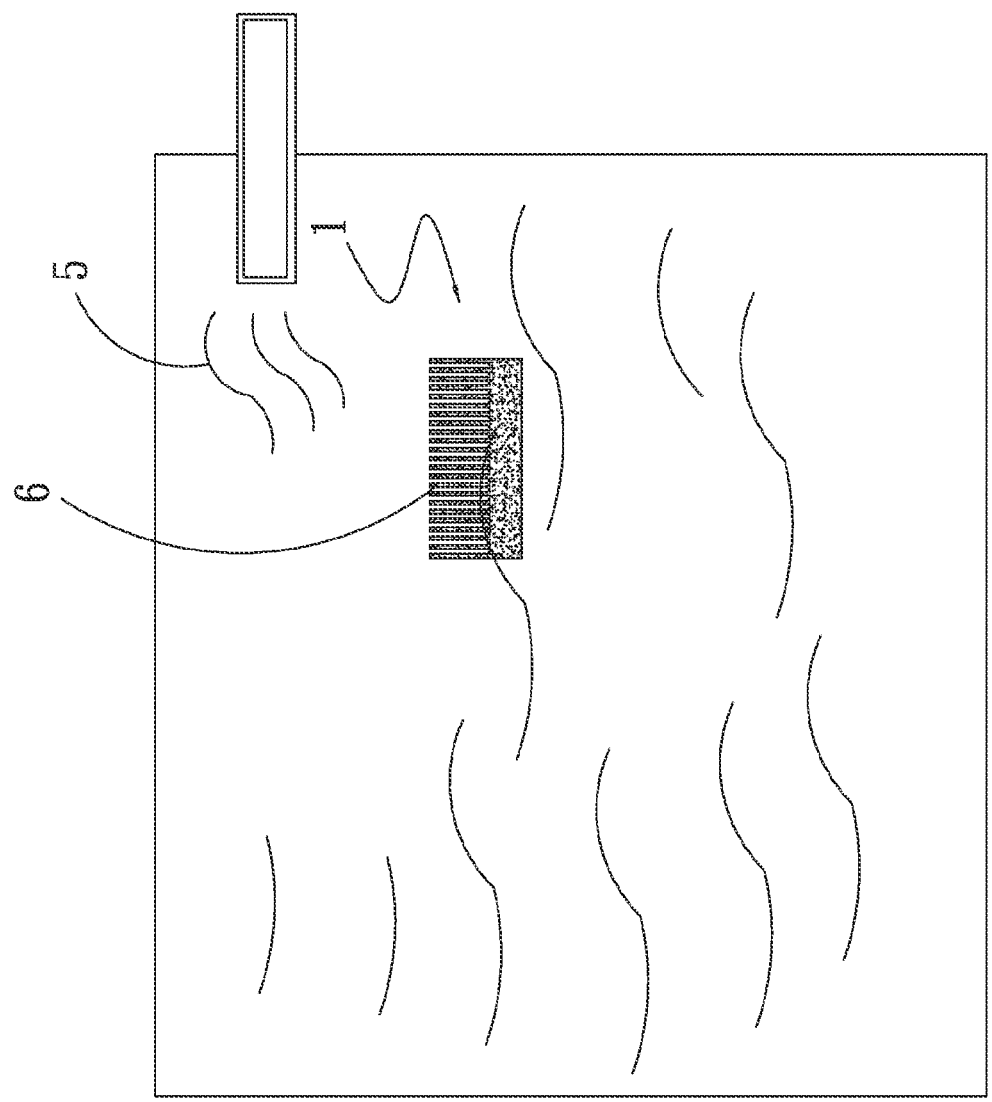
FIG. 4 schematically illustrates a reduction reaction occurred on a heat-dissipation unit of the present invention and a nano compound coating thereof.

As shown in FIG. 4, the heat-dissipation unit 1 (i.e. the heat sink) is positioned in a high-temperature environment, and the reduction gas 5 is supplied into the high-temperature environment to perform a heat treatment and reduction process on the nano compound coating 6 on the heat-dissipation unit 1. The reduction gas 5 can be any one of $H_2S$, $H_2$, CO, and $NH_3$; and is preferably $H_2$. A reduction temperature for the reduction process is ranged between 600° C. and 1000° C., and is preferably ranged between 650° C. and 850° C.

Step S4: Forming a nano metal compound thin film 2 on the heat-dissipation unit 1 after completion of the heat treatment and reduction process.

After completion of the heat treatment and the reduction process in the step S3, a diffusion reaction and a reduction-oxidation reaction occur between the reduction gas 5 (i.e. $H_2$) and the nano compound coating 6 and the heat-dissipation unit 1. And, after completion of these reactions, at least a nano metal compound thin film 2 is formed on the heat-dissipation unit 1 (i.e. the heat sink).

Figure 5:
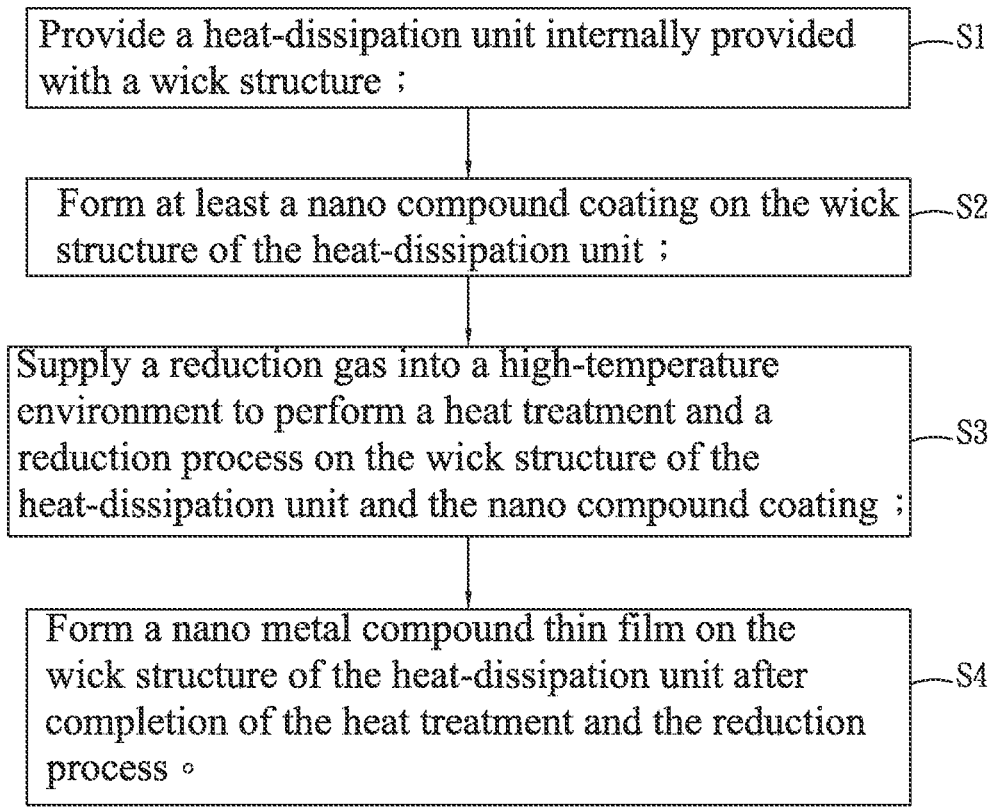
FIG. 5 is a flowchart showing the steps included in a method of depositing an oxidation-resistant nano thin film on a heat-dissipation unit according to a second embodiment of the present invention.

FIG. 5 is a flowchart showing the steps included in a method according to a second embodiment of the present invention for depositing an oxidation-resistant nano thin film on a heat-dissipation unit. Please refer to FIGS. 1d, 5, 6 and 7 at the same time. The method includes the following steps:

Step S1: Providing a heat-dissipation unit 1 internally provided with a wick structure 114.

A heat-dissipation 1 internally provided with a wick structure 114 is provided. The heat-dissipation unit 1 can be a uniform temperature plate as shown in FIG. 1b, a heat pipe as shown in FIG. 1d, a loop heat pipe as shown in FIG. 1e, or a water block as shown in FIG. 1f. The method according to the second embodiment of the present invention is explained based on a heat-dissipation unit 1 configured as a heat pipe shown in FIG. 1d.

Step S2: Forming at least a nano compound coating 6 over the wick structure 114 in the heat-dissipation unit 1 through a sol-gel process.

At least a nano compound coating 6 is formed on the wick structure 114 in the heat-dissipation unit 1 (i.e. the heat pipe). The nano compound coating 6 can be formed of any oxide, nitride, carbide or sulfide. The method according to the second embodiment of the present invention is explained based on a nano compound coating 6 formed of an oxide. The oxide is selected from the group consisting of $SiO_2$, $TiO_2$, $Al_2O_3$, $ZrO_2$, CaO, $K_2O$, and ZnO. In the illustrated second embodiment, the oxide is $Al_2O_3$. And, only one single layer or a plurality of layers of the nano compound coating 6 can be formed. In the case of forming a plurality of layers of the nano compound coating 6, either different oxides are alternatively coated or the oxide, nitride, carbide and sulfide are alternately coated. The nano compound coating 6 can be formed through sol-gel process. The sol-gel process can be implemented in any one of the following manners: dip-coating deposition, settle-coating deposition, spin-coating deposition, brush-coating deposition, and wet-coating deposition.

Figure 6:
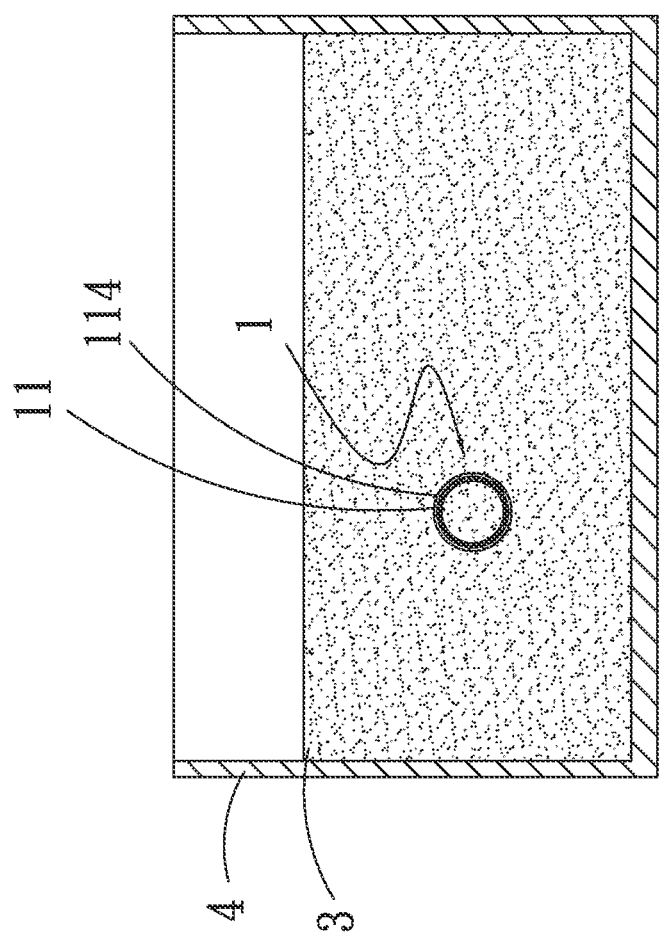
FIG. 6 schematically illustrates the forming of a nano compound coating on a heat-dissipation unit of the present invention.
Figure 7:
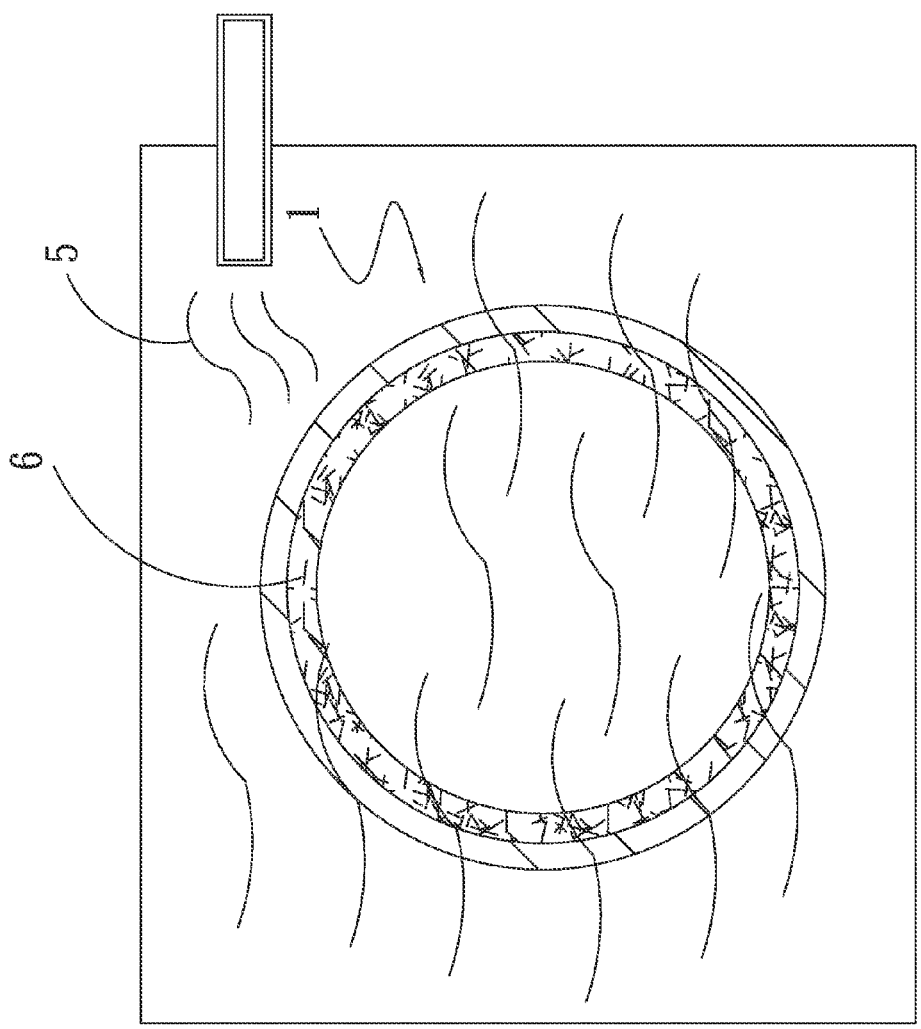
FIG. 7 schematically illustrates a heat treatment and reduction process performed on a heat-dissipation unit of the present invention and a nano compound coating thereof.

In the illustrated second embodiment, while the oxide nano thin film 6 is formed through dip-coating deposition, it is understood the oxide nano thin film 6 can also be formed through other types of deposition according to the sol-gel process. As shown in FIG. 6, in the sol-gel process, $Al_2O_3$ particles are soaked in a water solution 3, and the water solution 3 along with the $Al_2O_3$ particles are poured into a tank 4 and thoroughly mixed, so that the $Al_2O_3$ particles are evenly dispersed in the water solution 3 contained in the tank 4. Then, immerse the portion of the heat-dissipation unit 1 with the wick structure 114 in the water solution 3 contained in the tank 4, and allow the heat-dissipation unit 1 to remain still in the water solution 3 in the tank 4 for a predetermined period of time. Finally, remove the heat-dissipation unit 1 from the water solution 3 or drain off the water solution 3 from the tank 4, so that the $Al_2O_3$ particles are attached to an outer surface of the wick structure 114.

Step S3: Supplying a reduction gas 5 into a high-temperature environment to perform a heat treatment and a reduction process on the wick structure 114 of the heat-dissipation unit 1 and the nano compound coating 6 on the surface of the wick structure 114.

The heat-dissipation unit 1 (i.e. the heat pipe) is positioned in a high-temperature environment, and the reduction gas 5 is supplied into the high-temperature environment to perform a heat treatment and a reduction process on the wick structure 114 and the nano compound coating 6. The reduction gas 5 can be any one of $H_2S$, $H_2$, CO, and $NH_3$; and is preferably $H_2$. A reduction temperature for the reduction process is ranged between 600° C. and 1000° C., and is preferably ranged between 650° C. and 850° C.

Step S4: Forming a nano metal compound thin film 2 on the wick structure 114 of the heat-dissipation unit 1 after completion of the heat treatment and reduction process.

After completion of the reduction process in the step S3, a diffusion reaction and a reduction-oxidation reaction occur between the reduction gas 5 (i.e. $H_2$) and the nano compound coating 6 and the wick structure 114. And, after completion of these reactions, at least a nano metal compound thin film 2 is formed on the wick structure 114 of the heat-dissipation unit 1.

In the methods according to different embodiments of the present invention, the $Al_2O_3$ used is a nano-sol surface pretreatment chemical (Product Number A-100) supplied by Chung-Hsin Technological Consultants, Inc. (Taiwan). This nano-sol surface pretreatment chemical mainly contains 1.0% of nanoparticles of $Al_2O_3$ having a particle size≤10 nm, and has the product characteristics of a specific gravity of 1.01±0.03; a flash point higher than 100° C.; a colorless and transparent appearance; a pH value of 7.0±0.5; and a working temperature of 10-40° C.

After completion of the deposition of the oxidation-resistant nano thin film on the heat-dissipation unit using the methods according to different embodiments of the present invention, the structure of the formed nano metal compound thin films is analyzed via X-ray photoelectron spectroscopy (XPS) technique. In formation about the equipment used in the XPS analysis is as follows:
Name of equipment supplier: PerkinElmer (USA)
Voltage: 15 KV
Watt: 300 W
Vacuum degree: $2.5*10^{-9}$ torr Following steps are included in the XPS analysis of the nano metal compound thin films formed according to the present invention:
Step 1: Performing a full scan on the nano metal compound thin film with a spot size of 0.1 Å;
Step 2: Etching downward to two different depths of 10 Å and 500 Å below the surface of the nano metal compound thin film, and performing a multiplex (local) scan with a spot size of 0.05 Å; and
Step 3: Comparing the obtained XPS spectra with standard spectra and performing a quantitative analysis.

Figure 8:
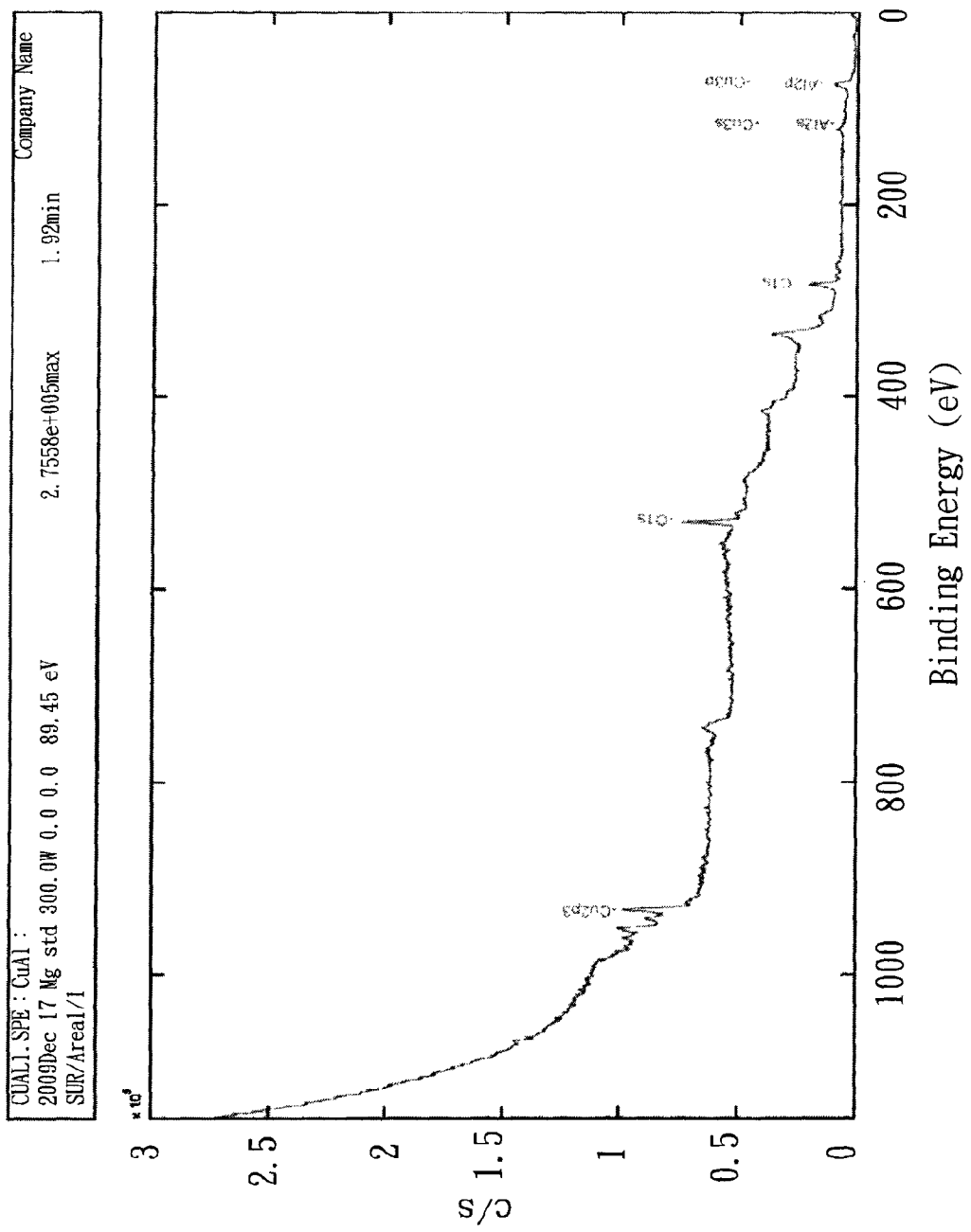
FIGS. 8 to 14 are X-ray photoelectron spectroscopy spectra analyzing the surface of the heat-dissipation units according to different embodiments of the present invention.
Figure 13:
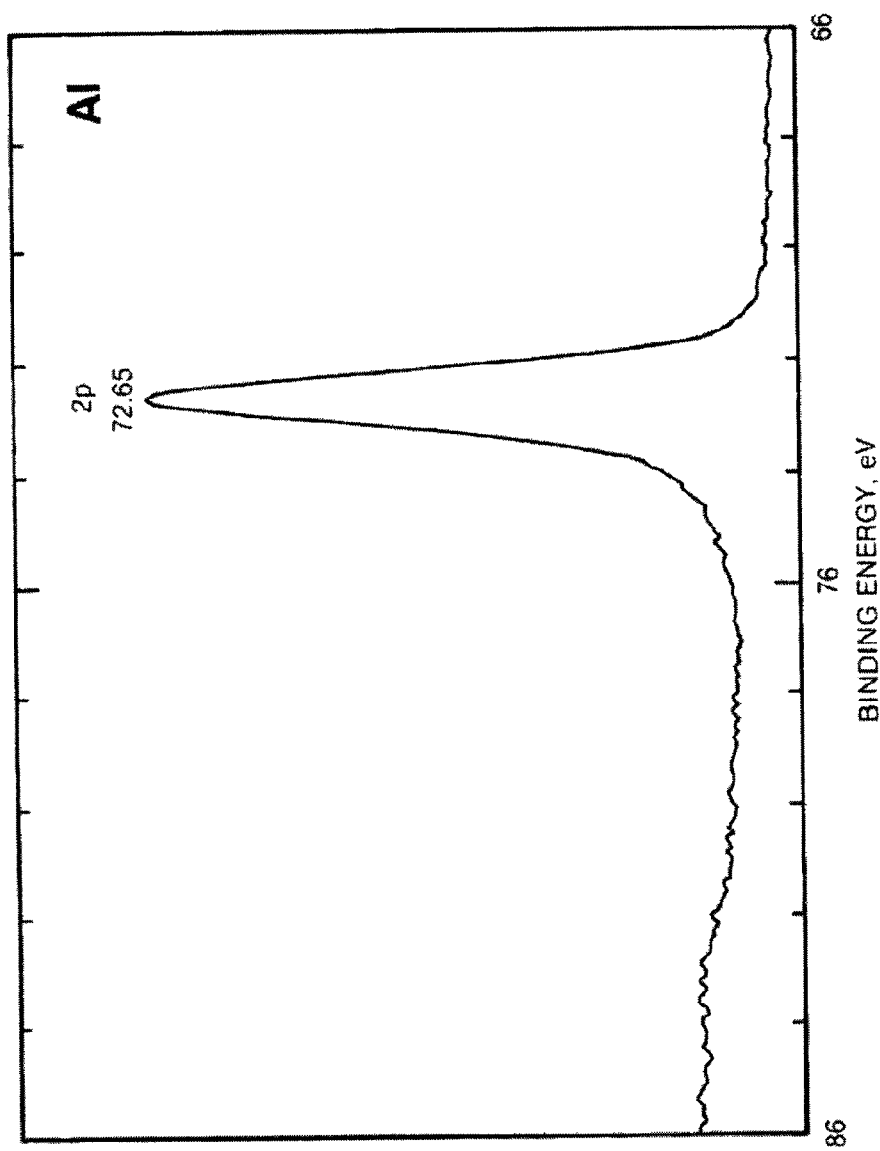

Please refer to FIGS. 8 and 13 that are full-scan XPS spectra of specimens with the formed nano metal compound thin films. As can be seen from the spectra, there are copper, aluminum and oxygen contained in the nano metal compound thin films.

Figure 9:
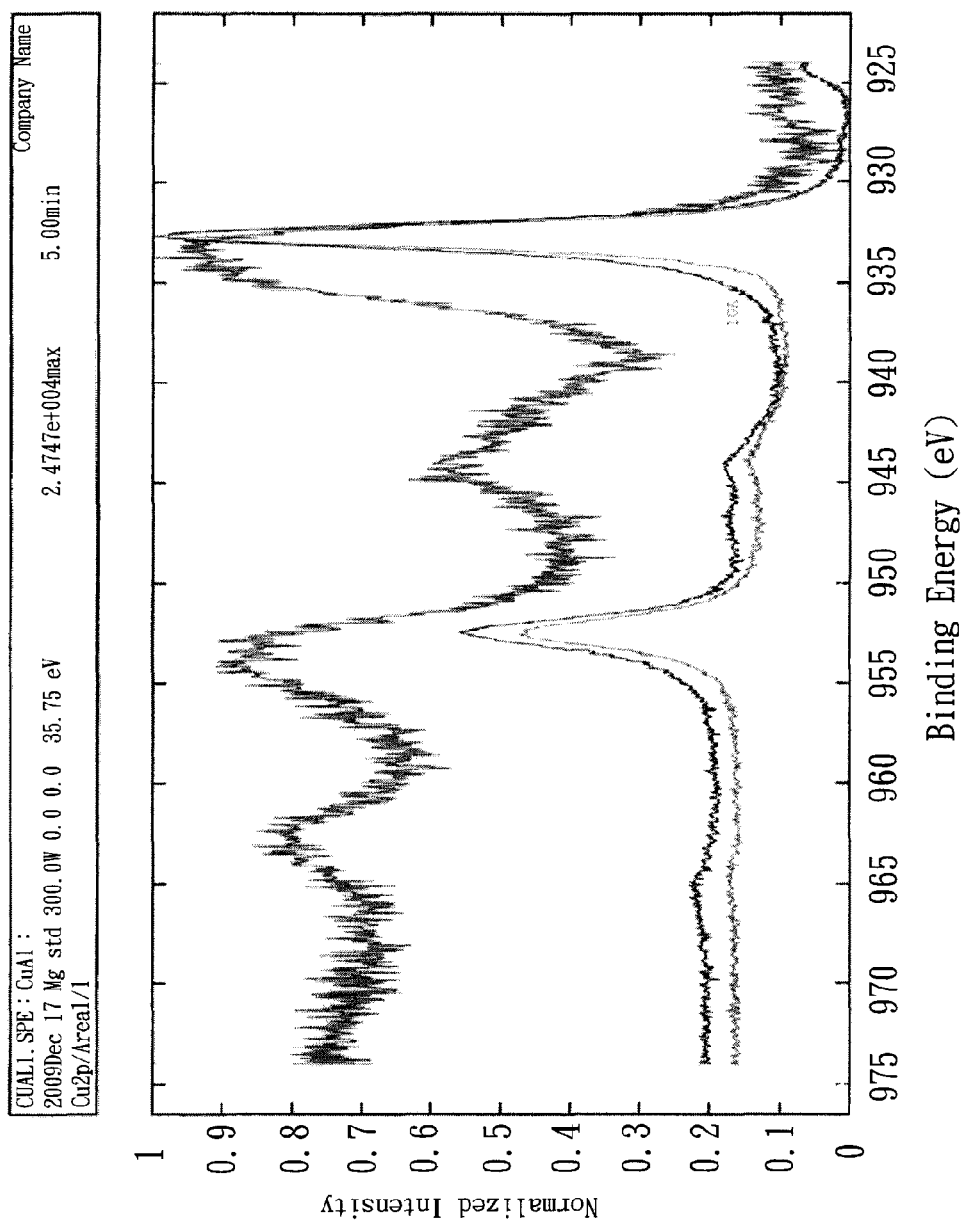
Figure 12:
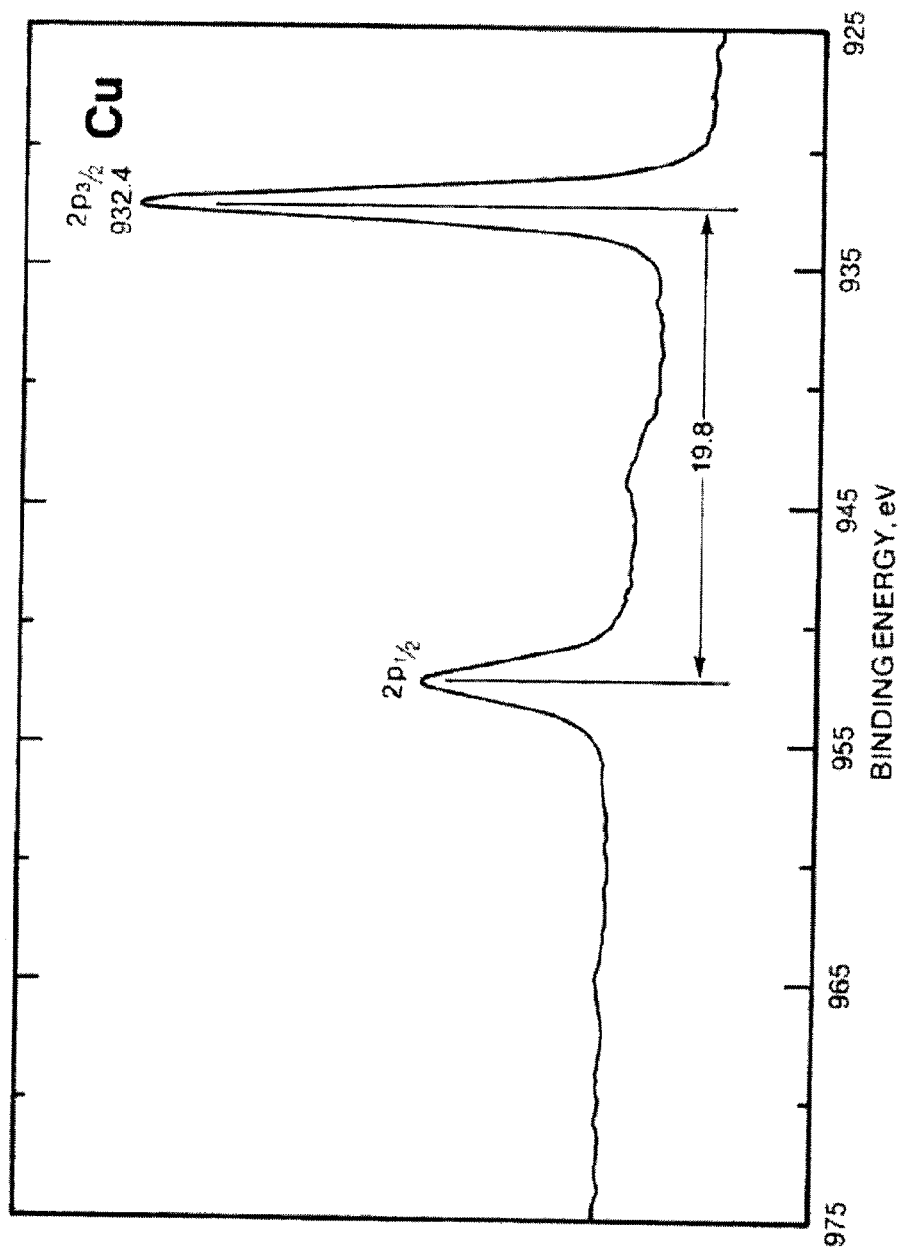

FIGS. 9 and 12 are local-scan XPS spectra showing copper binding energy values. The local scan is performed at etching depths of 1 nm and 50 nm into the material. As can be seen from FIG. 12, there is a layer of copper oxide less than 1 nm in thickness formed on the surface of the material, while copper exists 1 nm below the surface of the material.

Figure 10:
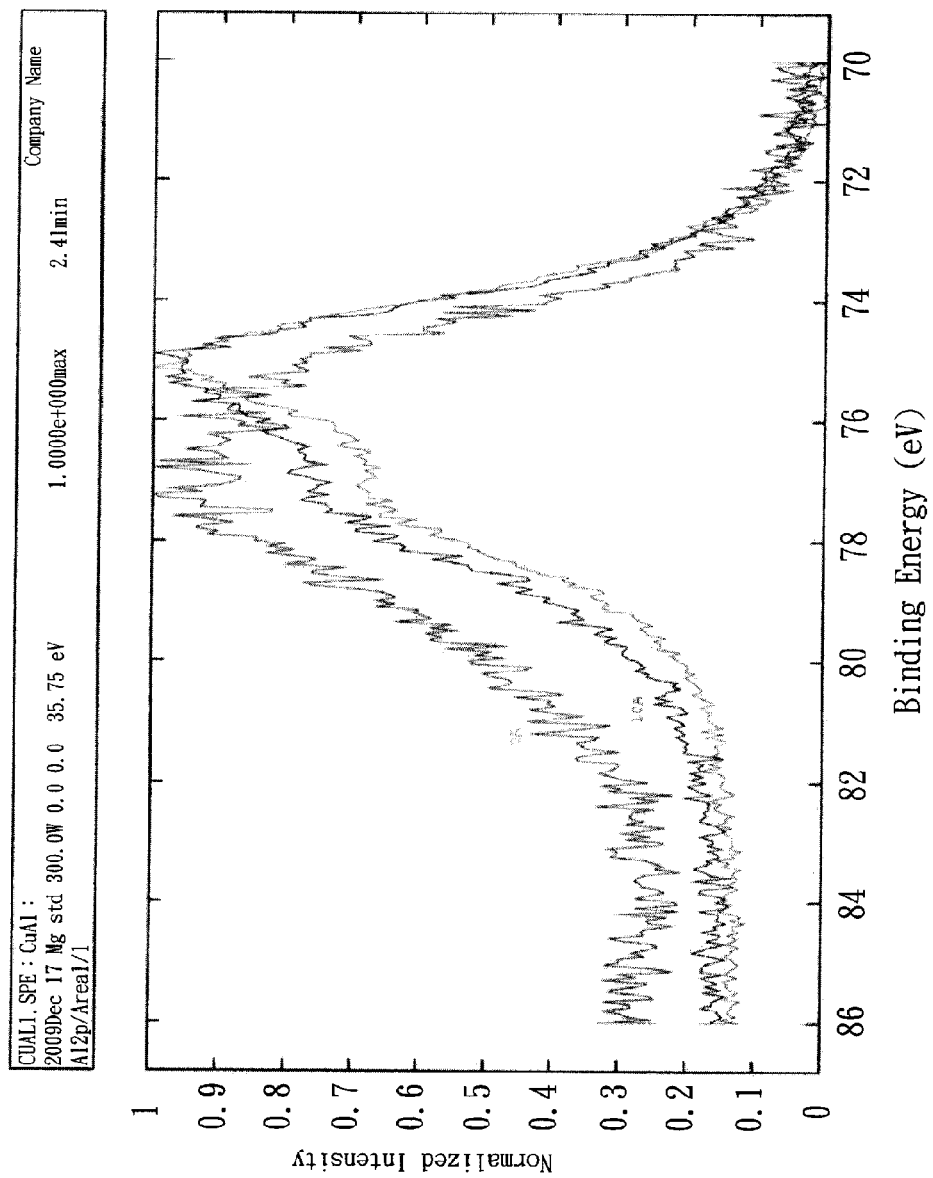
Figure 11:
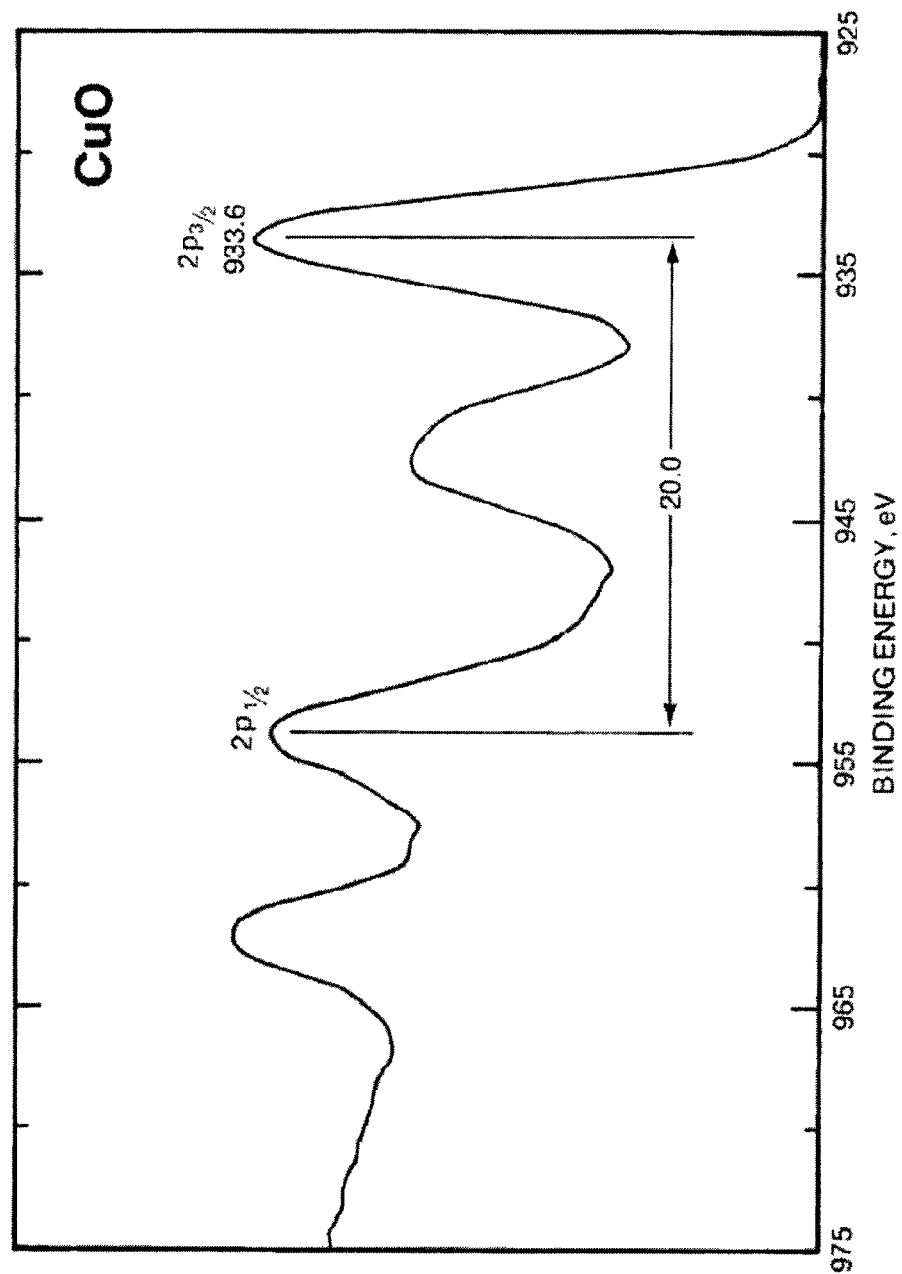
Figure 14:
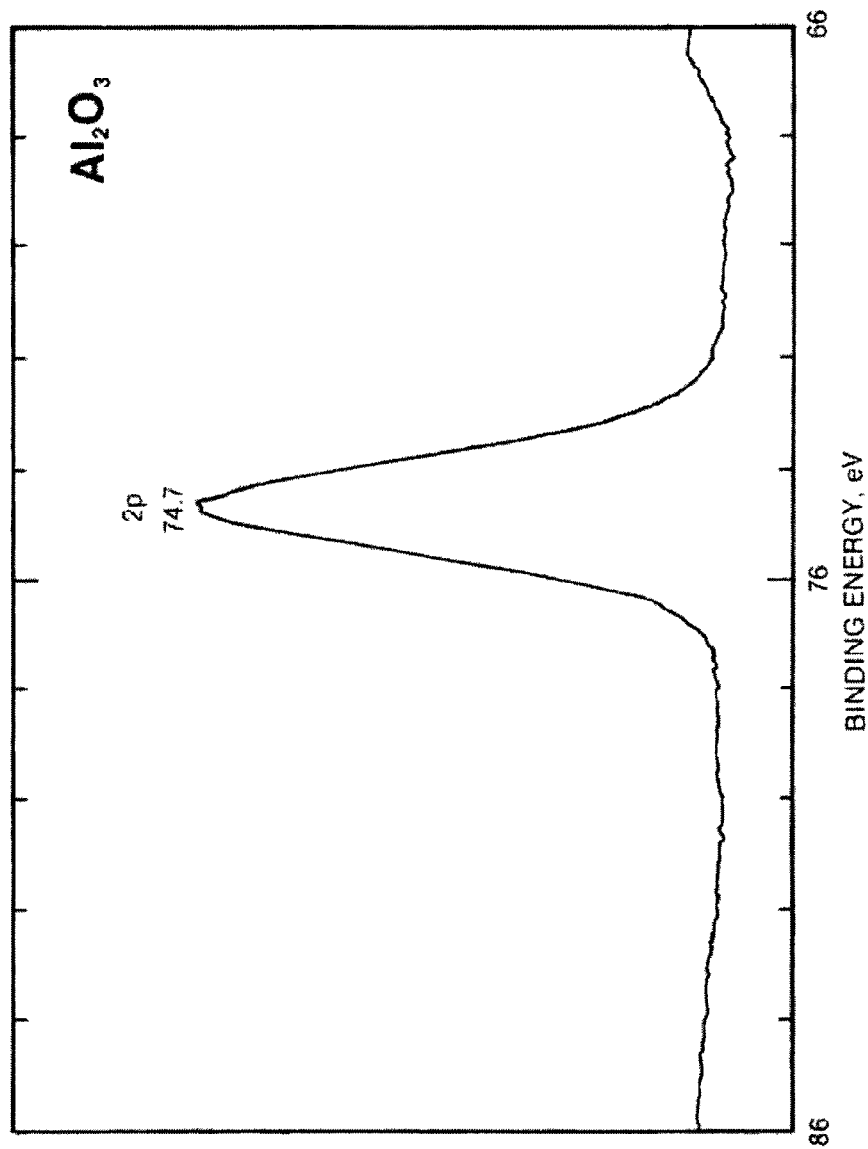

FIGS. 10, 11 and 14 are local-scan XPS spectra showing aluminum binding energy values. The local scan is performed at etching depths of 1 nm and 50 nm into the material. As can be seen from these figures, there is a layer of $Al_2O_3$ compound (77.44 eV) on the material surface. This layer of compound is a chemical compound of $Al_2O_3$ and CuO, as shown in FIG. 11. When the local scan is performed at an etching depth of 1 nm, $Al_2O_3$ (74.86 eV) appears; and when the local scan is performed at an etching depth of 50 nm, $Al_2O_3$ still appears, as shown in FIG. 14.

From the above analysis, it can be found the $Al_2O_3$ sol is a highly strong oxidant. When the $Al_2O_3$ sol is coated on the surface of copper, it will cause oxidation of the copper quickly, particularly at a high temperature. When $H_2$ is used in a high-temperature environment to reduce the heat-dissipation unit coated with copper oxide and aluminum oxide, the copper oxide on the surface of the heat-dissipation unit is reduced and reacts with the aluminum oxide to form a compound $CuAl_2O_3$, as shown in FIG. 8. This layer of compound is able to stop oxidation of copper and forms an oxidation-resistant nano thin film.

What is claimed is:

1. A method of depositing oxidation-resistant nano thin film on heat-dissipation unit, comprising the following steps:
   providing a heat-dissipation unit;
   forming at least one nano thickness coating on a surface of the heat-dissipation unit under vacuum; wherein the at least one nano thickness coating has a thickness of 1 nm to 100 nm,
   supplying a reduction gas into a high-temperature environment having a temperature ranging between 600° C. and 1000° C. to perform a heat treatment and a reduction process and thereafter a diffusion reaction and a reduction-oxidation reaction occurs between the reduction gas and the heat-dissipation unit and the nano thickness coating on the surface of the heat-dissipation unit wherein the reduction as is selected from the group consisting of $H_2S$, $H_2$, CO, and $NH_3$; and
   forming a nano thickness thin film of a metal compound selected from the group consisting of nitride, carbide, sulfide and oxide on the heat-dissipation unit by completing the heat treatment, the reduction process, the diffusion reaction, and the reduction-oxidation reaction.

2. The method of depositing oxidation-resistant nano thin film on heat-dissipation unit as claimed in claim 1, wherein the heat-dissipation unit is selected from the group consisting of a heat sink, a radiating fin assembly, a heat pipe, a flat heat pipe, a loop heat pipe, and a water block.

3. The method of depositing oxidation-resistant nano thin film on heat-dissipation unit as claimed in claim 1, wherein the reduction process is performed at a temperature ranged between 650° C. and 850° C.

4. The method of depositing oxidation-resistant nano thin film on heat-dissipation unit as claimed in claim 1, wherein the at least one nano thickness coating is formed on the surface of the heat-dissipation unit through a process selected from the group consisting of physical vapor deposition (PVD), chemical vapor deposition (CVD), and sol-gel process.

5. The method of depositing oxidation-resistant nano thin film on heat-dissipation unit as claimed in claim 4, wherein the sol-gel process is implemented in a manner selected from the group consisting of dip-coating deposition, settle-coating deposition, spin-coating deposition, brush-coating deposition, and wet-coating deposition.

* * * * *